(12) United States Patent
Khachatryan et al.

(10) Patent No.: US 9,277,602 B2
(45) Date of Patent: Mar. 1, 2016

(54) ORGANIC ELECTROLUMINESCENT DISPLAY DEVICE

(71) Applicant: Samsung Display Co., Ltd., Yongin, Gyeonggi-Do (KR)

(72) Inventors: Hayk Khachatryan, Hwaseong-si (KR); Danbi Choi, Suwon-si (KR); Hyunwoo Koo, Hwaseong-si (KR); Taewoong Kim, Yongin-si (KR)

(73) Assignee: SAMSUNG DISPLAY CO., LTD. (KR)

(*) Notice: Subject to any disclaimer, the term of this patent is extended or adjusted under 35 U.S.C. 154(b) by 0 days.

(21) Appl. No.: 14/639,226

(22) Filed: Mar. 5, 2015

(65) Prior Publication Data

US 2015/0319813 A1 Nov. 5, 2015

(30) Foreign Application Priority Data

Apr. 30, 2014 (KR) .................. 10-2014-0052584

(51) Int. Cl.
*H05B 33/04* (2006.01)
*H05B 33/14* (2006.01)

(52) U.S. Cl.
CPC .............. *H05B 33/04* (2013.01); *H05B 33/145* (2013.01)

(58) Field of Classification Search
None
See application file for complete search history.

(56) References Cited

U.S. PATENT DOCUMENTS

| 5,665,802 | A | 9/1997 | Maki et al. |
| 6,570,325 | B2 | 5/2003 | Graff et al. |
| 7,968,146 | B2 | 6/2011 | Wagner et al. |
| 2001/0054867 | A1* | 12/2001 | Kubota .................. 313/504 |
| 2005/0062052 | A1* | 3/2005 | Yang et al. .............. 257/79 |
| 2013/0140547 | A1 | 6/2013 | Lee et al. |
| 2013/0153880 | A1* | 6/2013 | Yamamoto et al. ........... 257/40 |
| 2014/0124767 | A1* | 5/2014 | Maindron et al. ............ 257/40 |
| 2015/0155523 | A1* | 6/2015 | Kamiya .................... 257/40 |

FOREIGN PATENT DOCUMENTS

| KR | 1020120046427 A | 5/2012 |
| KR | 1020120047497 A | 5/2012 |
| KR | 1020120108926 A | 10/2012 |
| KR | 1020120113555 A | 10/2012 |
| KR | 1020120133279 A | 12/2012 |
| KR | 1020120138345 A | 12/2012 |
| KR | 1020130102519 A | 9/2013 |

OTHER PUBLICATIONS

Abadie, M. J. M., et al., "Polyimides and Other High-Temperature Polymers", Elsevier, 1991.

Choi et al., "Polymers for flexible displays: From material selection to device applications", Prog. Polym. Sci., 33, 2008-, pp. 581-630.

(Continued)

*Primary Examiner* — Ashok Patel
(74) *Attorney, Agent, or Firm* — Cantor Colburn LLP

(57) ABSTRACT

An organic electroluminescent display device includes a substrate, pixels on the substrate and each including an organic emission layer, and a sealing member covering the pixels and configured to block moisture and gas from outside the organic electroluminescent display device to the pixels. The sealing member includes an inorganic layer of which a lower surface is opposite to an upper surface thereof and closer to the pixels than the upper surface, and each of the upper surface and the lower surface has an uneven shape.

15 Claims, 9 Drawing Sheets

(56) References Cited

OTHER PUBLICATIONS

Geffroy, "Organic light-emitting diode (OLED) technology: materials, devices and display technologies", Polymer International, 55, 2006, pp. 572-582.

Gregory P. Crawford, "Flexible Flat Panel Display", John Wiley & Sons, Ltd., 2005.

J. Alvarado-Rivera, et al., "Hardness and wearing properties of SiO2-PMMA hybrid coatings reinforced with Al2O3 nanowhiskers", Phys. Stat. Sol.,11, 2007, pp. 4254-4259.

Jay Lewis, Material challenge for flexible organic devices, Materials Today, vol. 9, No. 4, Apr. 2006, pp. 38-45.

Kim et al., "High-quality thin-film passivation by catalyzer-enhaned chemical vapor deposition for organic light-emitting diodes", Applied Physics Letters, 90, 2007, pp. 013502-1-013502-3.

Kim et al., "OLED investment to continue expanding; recent correction offers good buying opportunity", OLED Industry, Industry Analysis, WOORI Investment & Securities, May 7, 2012.

Morales-Acosta et al., "PMMA-SiO2 organic-inorganic hybrid films: determination of dielectric characteristics", J. Sol-Gel. Sci. Technol., 58, 2011, pp. 218-224.

Srikulkit et al., "Transparent Coating Materials Based on Inorganic/Organic Composites", Journal of Metals, Materials and Minerals, Vo., 16, No. 2, 2006, pp. 33-40.

Sugimoto et al., "Flexible OLED Displays Using Plastic Substrates", Journal of Selected Topics in Quantum Electronics, vol. 10, No. 1, 2004, pp. 107-114.

Takekoshi T. et al., "Chapter 1: Polyimides: chemistry & structure-property relationships—literature review", Polyimides-Fundamentals and Applications, 1996.

\* cited by examiner

ORGANIC ELECTROLUMINESCENT DISPLAY DEVICE

This application claims priority to Korean Patent Application No. 10-2014-0052584, filed on Apr. 30, 2014, and all the benefits accruing therefrom under 35 U.S.C. §119, the entire contents of which are hereby incorporated by reference.

BACKGROUND (1) Field

The invention disclosed herein relates to organic electroluminescent display devices, and more particularly, to organic electroluminescent display devices including a sealing member covering pixels.

(2) Description of the Related Art

An organic electroluminescent display device includes pixels emitting light, and the pixels each include an anode, an organic emission layer disposed on the anode and emitting light, and a cathode disposed on the organic emission layer.

Also, the organic electroluminescent display device may further include a sealing member covering the pixels, and the sealing member blocks moisture and gas which may be introduced from outside the device to the pixels. In order to improve moisture resistance of the sealing member, the sealing member may include an inorganic material instead of an organic material. However, an inorganic sealing member may be more easily broken by external stress than an organic sealing member.

SUMMARY

One or more exemplary embodiment of the invention provides an organic electroluminescent display device having improved product life and reliability.

An exemplary embodiment of the invention provides an organic electroluminescent display device including: a substrate; pixels on the substrate and each including an organic emission layer; and a sealing member covering the pixels and configured to block moisture and gas from outside the organic electroluminescent display device to the pixels.

In an exemplary embodiment, the sealing member includes an inorganic layer of which a lower surface is opposite to an upper surface thereof and closer to the pixels than the upper surface. Each of the upper surface and the lower surface of the inorganic layer has an uneven shape.

BRIEF DESCRIPTION OF THE DRAWINGS

The accompanying drawings are included to provide a further understanding of the invention, and are incorporated in and constitute a part of this disclosure. The drawings illustrate exemplary embodiments of the invention and, together with the description, serve to explain the invention. In the drawings.

DETAILED DESCRIPTION

Figure 1A:
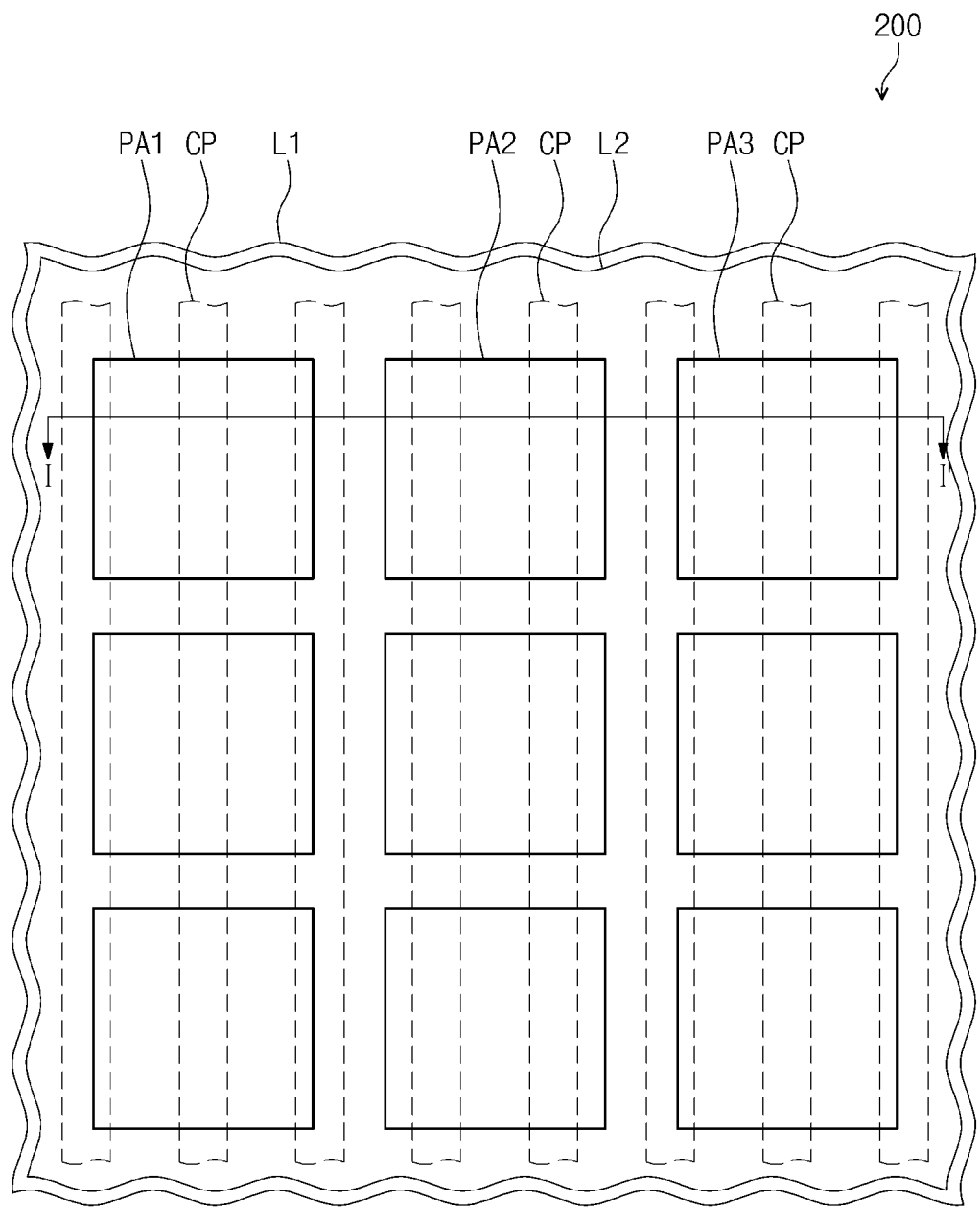
FIG. 1A is a plan view illustrating an exemplary embodiment of an organic electroluminescent display device according to the invention.

Hereinafter, exemplary embodiments of the invention will be described in detail with reference to the accompanying drawings. The foregoing objects, features and advantages of the invention will become more apparent through the description of the exemplary embodiments related to drawings. The invention may, however, be embodied in different forms and should not be construed as limited to the exemplary embodiments set forth herein. Rather, these exemplary embodiments are provided so that this disclosure will be thorough and complete, and will fully convey the scope of the invention to those skilled in the art. Therefore, the scope of the invention should not be construed as being limited to the following exemplary embodiments. Like reference numerals refer to like elements throughout.

Also, it will be understood that although the terms "first," "second," etc. may be used herein to describe various components, these components should not be limited by these terms. These components are only used to distinguish one component from another. In addition, it will be understood that when an element such as a layer, film, region, or substrate is referred to as being "on" another element, it can be directly on the other element or intervening elements may also be present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" and "upper" may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 1B:
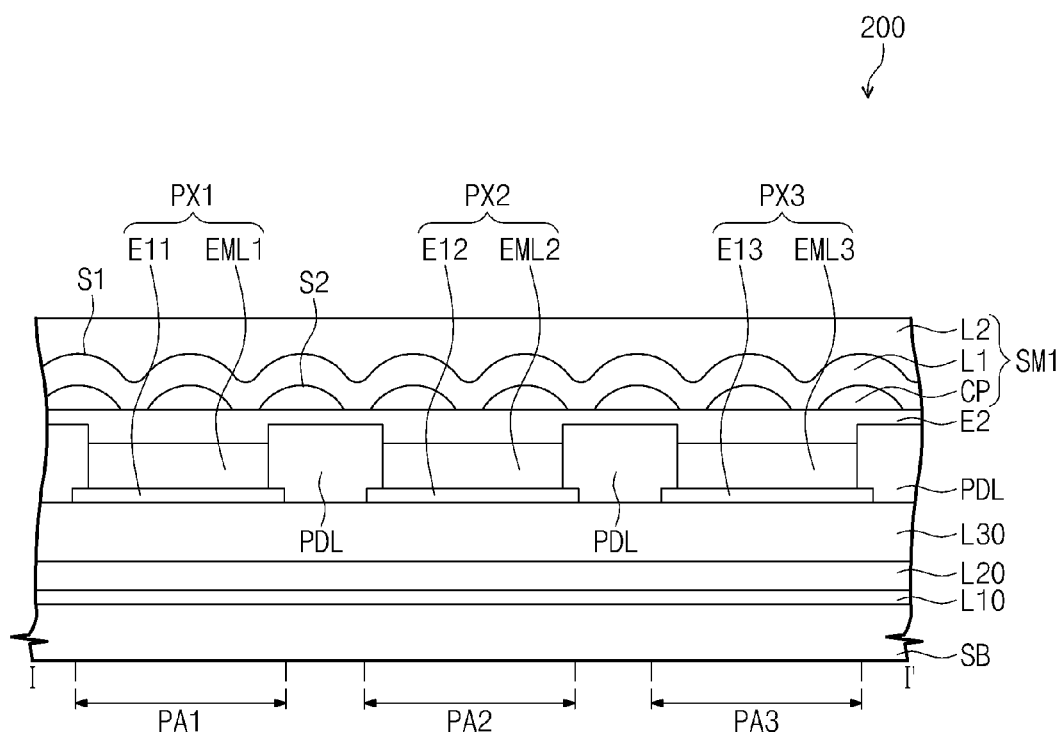
FIG. 1B is a cross-sectional view taken along line I-I' shown in FIG. 1A.
Figure 2:
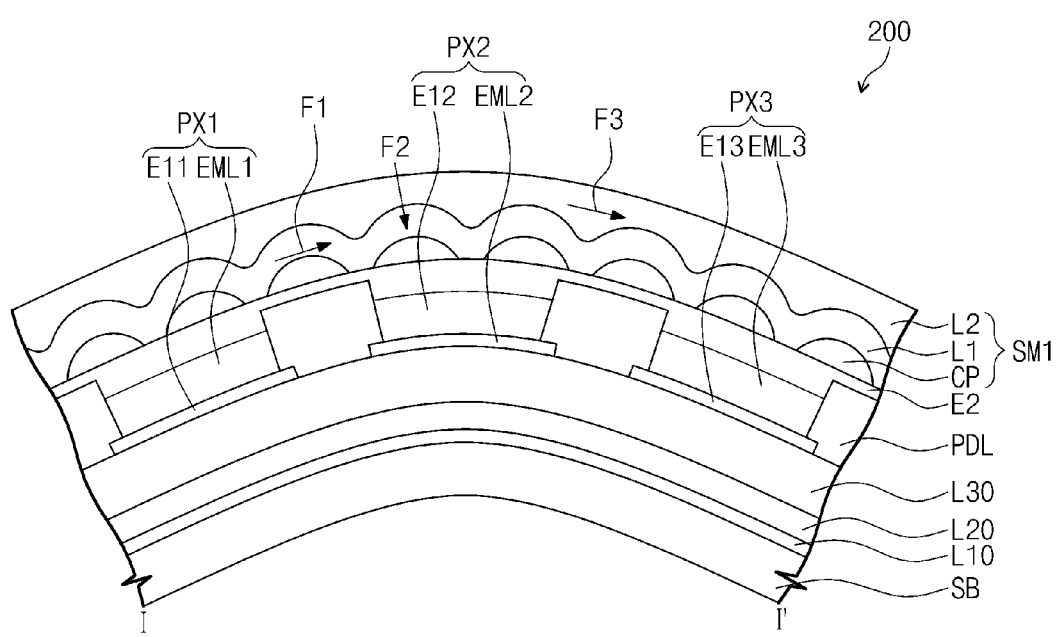
FIG. 2 illustrates the organic electroluminescent display device illustrated in FIG. 1A in a bent state.

FIG. 1A is a plan view illustrating an exemplary embodiment of an organic electroluminescent display device according to the invention, FIG. 1B is a cross-sectional view taken along line I-I' shown in FIG. 1A, and FIG. 2 illustrates the organic electroluminescent display device illustrated in FIG. 1A in a bent state.

Referring to FIGS. 1A, 1B, and 2, an organic electroluminescent display device 200 includes a substrate SB, a plurality of pixels and a sealing member SM1.

In the exemplary embodiment, the substrate SB may be a flexible substrate, and for example, the substrate SB may have a flexible property by including plastics such as polyimide ("PI"), polyethylene terephthalate ("PET"), polyethylene naphthalate ("PEN") or polycarbonate. According to another exemplary embodiment of the invention, the substrate SB may be a glass substrate.

A plurality of pixel areas is defined in and/or on the substrate SB. First to third pixel areas PA1, PA2 and PA3 among the plurality of pixel areas are illustrated as an example of the plurality of pixel areas in FIG. 1A, but the invention is not limited thereto. The plurality of pixels is disposed in one-to-one correspondence with the plurality of pixel areas, and the plurality of pixels may emit light so that the organic electroluminescent display device 200 may display an image.

A structure of the plurality of pixels will be described below by using first to third pixels PX1, PX2 and PX3, which are disposed in one-to-one correspondence with the first to third pixel areas PA1, PA2, and PA3, among the plurality of pixels as an example.

The first pixel PX1 includes a first anode E11, and a first organic emission layer EML1 disposed on the first anode E11. The second pixel PX2 includes a second anode E12, and a second organic emission layer EML2 disposed on the second anode E12. The third pixel PX3 includes a third anode E13, and a third organic emission layer EML3 disposed on the third anode E13. Also, each of the first to third pixels PX1, PX2 and PX3 may further include a cathode E2 disposed on the first to third organic emission layers EML1, EML2 and EML3. Thus, light may be emitted from the first to third organic emission layers EML1, EML2 and EML3 by electrons provided from the cathode E2 to the first to third organic emission layers EML1, EML2 and EML3 and holes provided from the first to third anodes E11, E12 and E13 to the first to third organic emission layers EML1, EML2 and EML3.

In the exemplary embodiment, the first to third organic emission layers EML1, EML2 and EML3 may have a patterned shape in one-to-one correspondence with the first to third pixel areas PA1, PA2 and PA3, and the first to third organic emission layers EML1, EML2 and EML3 may emit light having different colors from one another. In an exemplary embodiment, for example, the first organic emission layer EML1 may be patterned in the first pixel area PA1 to emit red light, the second organic emission layer EML2 may be patterned in the second pixel area PA2 to emit green light, and the third organic emission layer EML3 may be patterned in the third pixel area PA3 to emit blue light.

In the exemplary embodiment, the cathode E2 may include a transparent conductive material such as indium tin oxide ("ITO") or indium zinc oxide ("IZO"). Accordingly, the light emitted from the first to third organic emission layers EML1, EML2 and EML3 may be emitted to outside the organic electroluminescent display device 200 by passing through the sealing member SM1, and the organic electroluminescent display device 200 may operate as a top-emission type.

In the exemplary embodiment, each of the first to third anodes E11, E12 and E13 may be electrically connected to a thin film transistor (not shown). The thin film transistor may include a gate electrode, an active pattern, a source electrode and a drain electrode, the gate electrode may be insulated from the active pattern by a gate insulating layer L10, and the source electrode and the drain electrode may be disposed on the active pattern and may be spaced apart from each other. A protective layer L20 covers the thin film transistor, and a planarization layer L30 is disposed on the protective layer L20. Thus, the flatness of one surface of the planarization layer L30, on which the first to third anodes E11, E12 and E13 are disposed, may be improved.

In the exemplary embodiment, the active pattern may include silicon. According to another exemplary embodiment of the invention, the active pattern may include an oxide semiconductor such as indium gallium zinc oxide ("IGZO"), ZnO, $SnO_2$, $In_2O_3$, $Zn_2SnO_4$, $Ge_2O_3$ and $HfO_2$, and may include a compound semiconductor such as GaAs, GaP and InP.

A pixel-defining layer PDL is disposed on the planarization layer L30. Openings are defined in the pixel-defining layer PDL and correspond to the first to third pixel areas PA1, PA2 and PA3. Thus, as an example, in the first pixel area PA1, the first organic emission layer EML1 may be in contact with the first anode E11 through the opening of the pixel-defining layer PDL.

The sealing member SM1 may be configured to block moisture and gas moving from the outside of the organic electroluminescent display device 200 to the pixels PX1, PX2 and PX3 by covering the first to third pixels PX1, PX2 and PX3. A structure of the sealing member SM1 will be described below.

In the exemplary embodiment, the sealing member SM1 includes protrusions CP, an inorganic layer L1 disposed on the protrusions CP, and an upper organic layer L2. The protrusions CP are spaced apart from one another and disposed on the cathode E2.

Each of the protrusions CP has a shape protruding toward the inorganic layer L1 from the cathode E2. In the exemplary embodiment, each of the protrusions CP may have a hemispherical shape in a cross-sectional view. However, the invention is not limited to the hemispherical shape of the protrusions CP. In another exemplary embodiment, for example, each of the protrusions CP may have a shape of a polygon, such as a triangle and a quadrangle, in the cross-sectional view.

In the exemplary embodiment, each of the protrusions CP may have an elongated linear shape in a plan view. The protrusion CP is continuous in the extension direction thereof. Specifically, each of the protrusions CP may extend along a first direction D1, and the protrusions CP may be arranged along a second direction D2 crossing the first direction D1, in the plan view.

In the exemplary embodiment, the protrusions CP may include an organic material having optical transmittance. In an exemplary embodiment, for example, the protrusions CP may include PI or PET.

The inorganic layer L1 may be disposed on the protrusions CP and may have an uneven shape due to the shape of the protrusions CP. The inorganic layer L1 is a single layer over the plurality of the first to third pixel areas PA1, PA2 and PA3 and common to each of the first to third pixel areas PA1, PA2 and PA3. Specifically, when defining an upper surface S1 of the inorganic layer L1 and a lower surface S2 which is opposite to the upper surface S1 and closer to the first to third pixels PX1, PX2 and PX3 than the upper surface S1, each of the upper surface S1 and the lower surface S2 has the uneven shape. Any one of the upper surface S1 and the lower surface S2 may include a portion that does not have the uneven shape. Referring to FIG. 1B, a portion of the lower surface S2 has a flat shape in contact with the cathode E2 and non-flat portions contribute to the uneven shape of the organic layer L1. However, in the exemplary embodiment, both the upper surface S1 and the lower surface S2 have portions which define the uneven shape. Thus, in the cross-sectional view, the inorganic layer L1 extends in a zigzag pattern in a direction closer to the substrate SB and a direction away from the substrate SB.

Hereinafter, a shape, in which the inorganic layer L1 extends in a zigzag or undulating pattern in the cross-sectional view, is defined as a shape of a spring, and an effect that may occur when the inorganic layer L1 has the shape of a spring will be described below. Specifically, since the protrusions CP are arranged spaced apart from each other in first and second directions D1 and D2, the inorganic layer L1 may have the shape of a spring extending in the first and second directions D1 and D2. While an exemplary embodiment includes the shape of the spring extending only in the first and second directions D1 and D2, the invention is not limited thereto.

As illustrated in FIG. 2, where the organic electroluminescent display device 200 is bent by an external force, stresses such as shear stress F1, compressive stress F2 and tensile stress F3 may be applied to the sealing member SM1.

Different from the exemplary embodiment of the invention, if a conventional inorganic layer L1 has a flat surface, the stresses may be concentrated on a portion of the flat surface to generate cracks in the portion of the conventional inorganic layer L1. Accordingly, moisture and gas, which may deteriorate the first to third pixels PX1, PX2 and PX3, may penetrate from the outside through the cracks in the conventional inorganic layer L1.

However, where the inorganic layer L1 has the shape of a spring as in the exemplary embodiment of the invention, the stresses may not be concentrated on a portion of the inorganic layer L1 of the invention, but may be easily distributed around the portion of the inorganic layer L1 of the invention. Thus, the occurrence of cracks in the inorganic layer L1 of the invention due to the local concentration of the stresses on the portion of the inorganic layer L1 may be reduced or effectively prevented, and as a result, the reduction of the moisture resistance of the sealing member SM1 including the inorganic layer L1 due to the cracks may be reduced or effectively prevented.

In the exemplary embodiment, the inorganic layer L1 may include an inorganic material such as silicon oxide, silicon nitride, silicon oxynitride, aluminum oxide and aluminum oxynitride. Thus, for the sealing member SM1 including the inorganic layer L1, a value of water vapor transmission rate ("WVTR") of about $10^{-6}$ $g/m^2/day$ or less may be easily obtained, and a value of oxygen transmission rate ("OTR") of about $10^{-5}$ $mL/m^2/day$ or less may be easily obtained. Accordingly, a lifetime of the organic electroluminescent display device 200 of 10,000 hours or more may be easily obtained.

The upper organic layer L2 covers the inorganic layer L1. In the exemplary embodiment, the upper organic layer L2 may include an organic material. The upper organic layer L2 absorbs the stresses applied to the inorganic layer L1 from the outside of the organic electroluminescent display device 200. Thus, the occurrence of cracks in the inorganic layer L1 may not only be reduced or effectively prevented by the shape of a spring of the inorganic layer L1, but the occurrence of cracks in the inorganic layer L1 may also be reduced or prevented by the upper organic layer L2 having a more flexible property than the inorganic layer L1. Accordingly, the reduction of the moisture resistance of the sealing member SM1 may be reduced or effectively prevented.

Figure 3A:
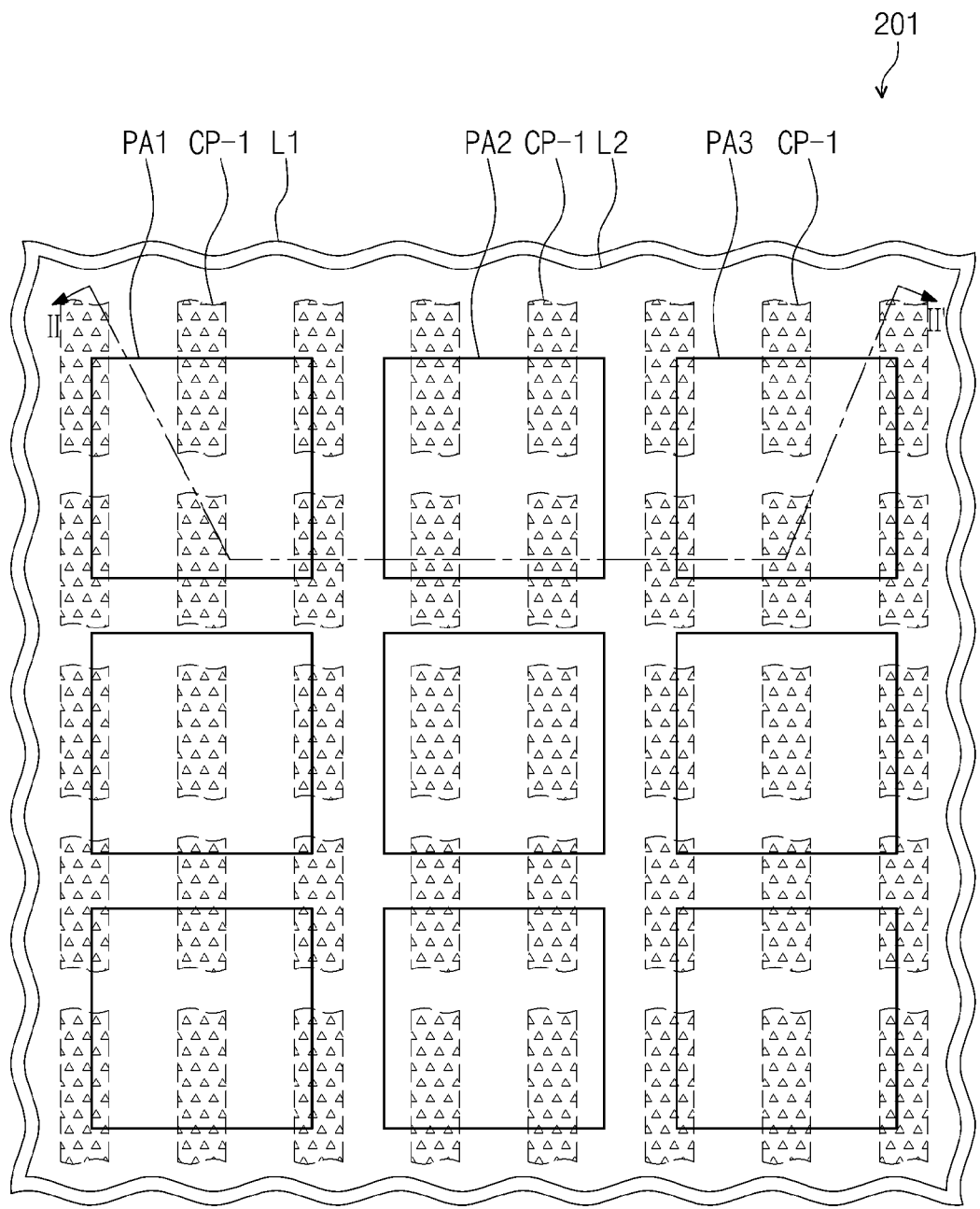
FIG. 3A is a plan view illustrating another exemplary embodiment of an organic electroluminescent display device according to the invention.
Figure 3A:
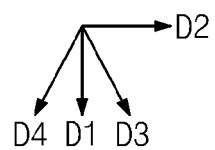
Figure 3B:
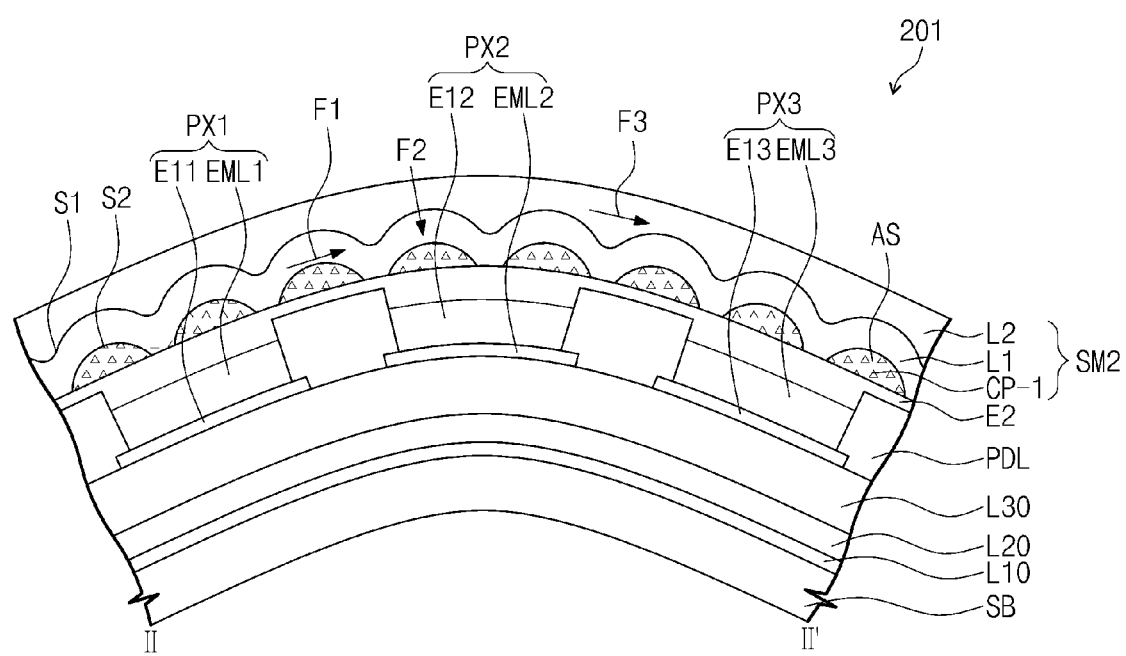
FIG. 3B is a cross-sectional view taken along line II-IF shown in FIG. 3A.

FIG. 3A is a plan view illustrating another exemplary embodiment of an organic electroluminescent display device according to the invention, and FIG. 3B is a cross-sectional view taken along line II-II' shown in FIG. 3A.

When describing FIGS. 3A and 3B, the same reference numerals are used for the same elements, and thus, the overlapping descriptions thereof are omitted.

Referring to FIGS. 3A and 3B, an organic electroluminescent display device 201 includes a plurality of pixels, and a sealing member SM2 covering the plurality of pixels.

In the exemplary embodiment, the sealing member SM2 includes protrusions CP-1, an inorganic layer L1 covering the protrusions CP-1, and an upper organic layer L2 covering the inorganic layer L1. Since each of the protrusions CP-1 has an island or discrete shape in a plan view, the protrusions CP-1 are spaced apart from one another. Thus, as in the exemplary embodiment described with reference to FIGS. 1A and 1B, each of the upper surface S1 and the lower surface S2 of the inorganic layer L1 disposed on the protrusions CP-1 may have an uneven shape due to the protrusions CP-1, and accordingly, the inorganic layer L1 having the shape of a spring extends in a zigzag pattern in a cross-sectional view.

In the exemplary embodiment, the protrusions CP-1 may include an organic material including moisture absorbents AS, such as calcium and barium. Accordingly, the moisture resistance of the sealing member SM2 may be improved by the moisture absorbents AS, and thus, the amount of moisture and gas penetrating the first to third pixels PX1, PX2, and PX3 may be minimized.

According to another exemplary embodiment of the invention, the protrusions CP-1 may include an organic material base portion coated with a moisture absorbent material such as calcium and barium, and according to still another exemplary embodiment of the invention, the protrusions CP-1 may be a body formed of a moisture absorbent material.

In the exemplary embodiment, since each of the protrusions CP-1 has the island shape and the protrusions CP-1 are arranged to be spaced apart from one another, the uneven shape defined on each of the upper surface S1 and the lower surface S2 of the inorganic layer L1 by the protrusions CP-1 may be more random. Referring to FIG. 3A, the protrusions CP-1 are disposed in each of first direction D1 extending columns and in second direction D2 extending rows, but the invention is not limited thereto.

Specifically, since the protrusions CP-1 are arranged spaced apart from each other in first and second directions D1 and D, as well as a third direction D3 or fourth direction D4 which respectively crosses the first and second directions D1 and D2, the inorganic layer L1 may have the shape of a spring extending in the third and fourth directions D3 and D4 as well as the first and second directions D1 and D2 in the cross-sectional view, as illustrated in FIG. 3B.

Figure 4A:
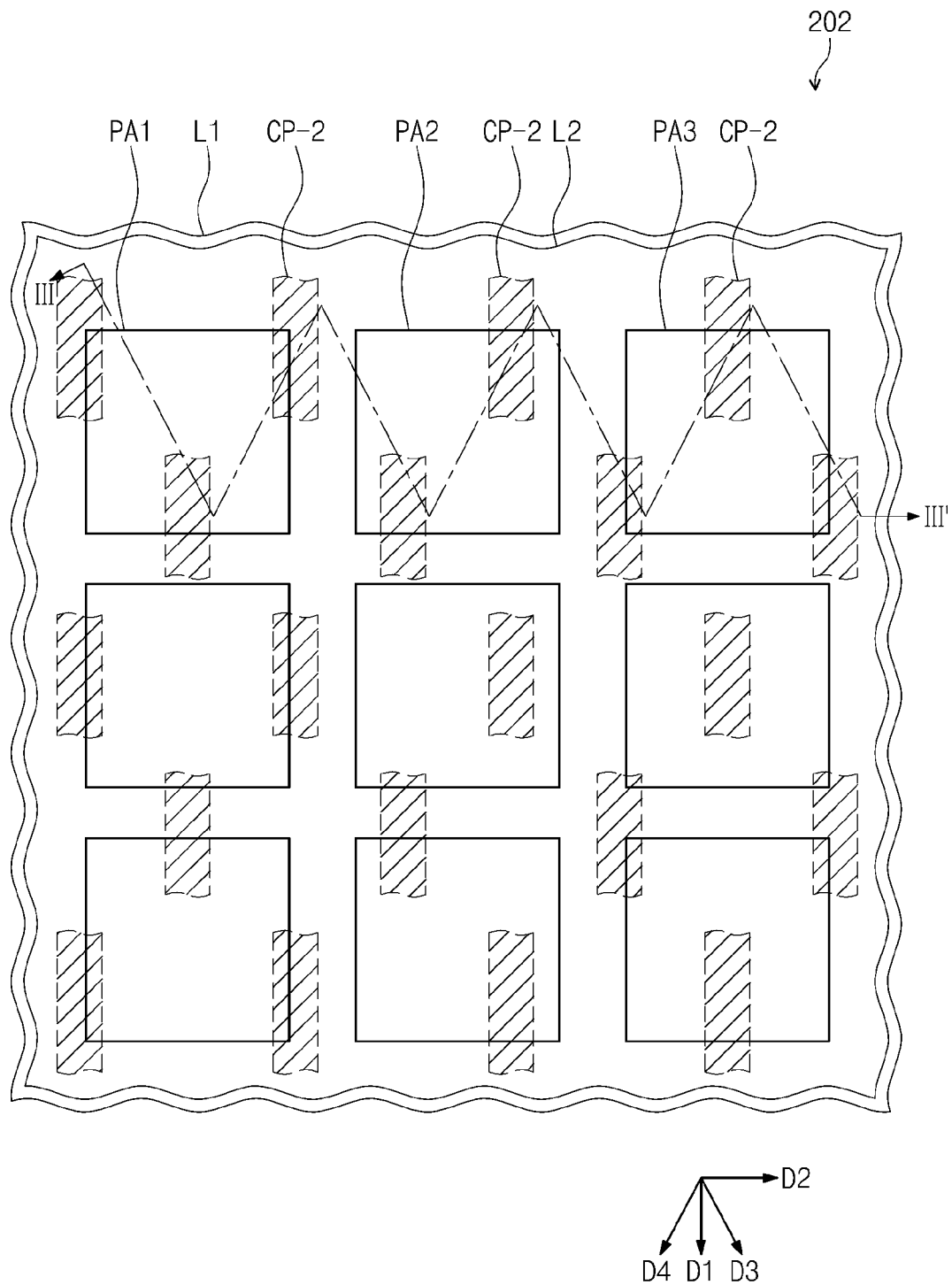
FIG. 4A is a plan view illustrating still another exemplary embodiment of an organic electroluminescent display device according to the invention.
Figure 4B:
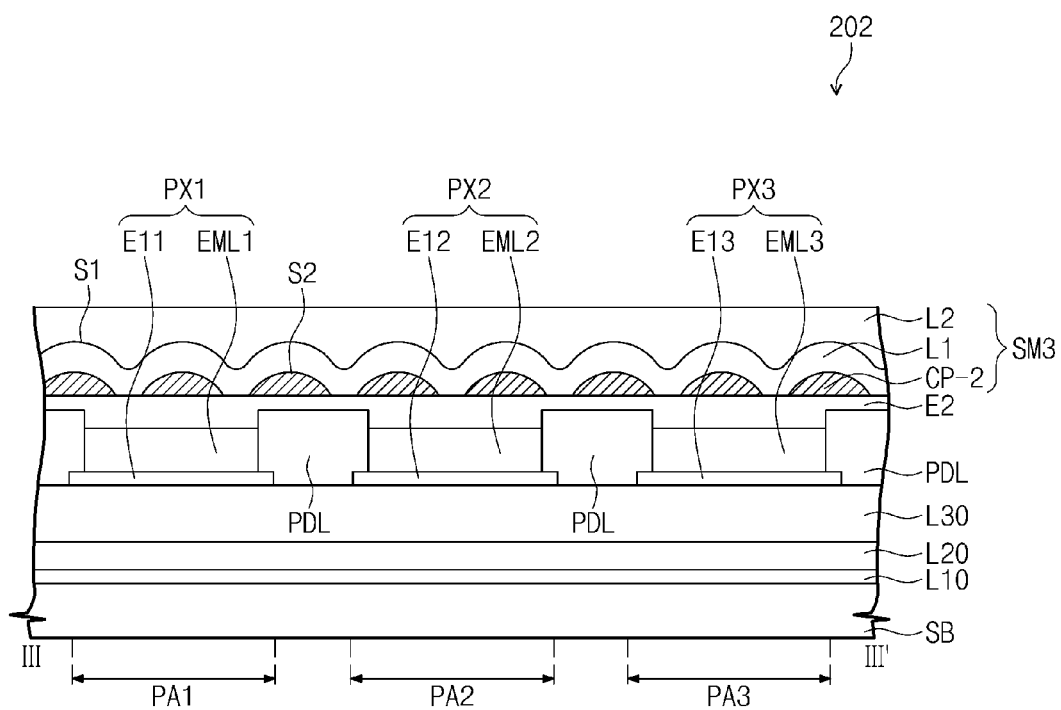
FIG. 4B is a cross-sectional view taken along line III-III' shown in FIG. 4A.

FIG. 4A is a plan view illustrating still another exemplary embodiment of an organic electroluminescent display device according to the invention, and FIG. 4B is a cross-sectional view taken along line III-III' shown in FIG. 4A.

When describing FIGS. 4A and 4B, the same reference numerals are used for the same elements, and thus, the overlapping descriptions thereof are omitted.

Referring to FIGS. 4A and 4B, an organic electroluminescent display device 202 includes a plurality of pixels, and a sealing member SM3 covering the plurality of pixels.

In the exemplary embodiment, the sealing member SM3 includes protrusions CP-2, an inorganic layer L1 and an upper organic layer L2.

In the exemplary embodiment, the protrusions CP-2 may include a metal. Where the protrusions CP-2 include metal, a strength of each of the protrusions CP-2 may be greater than that of the inorganic layer L1. Thus, the protrusions CP-2 may support the inorganic layer L1 due to the strength of the protrusions CP-2, and as a result, the uneven shape of the inorganic layer L1 may be maintained by the protrusions CP-2.

Similar to the exemplary embodiment described above with reference to FIGS. 3A and 3B, each of the protrusions CP-2 in the exemplary embodiment has an island shape in a plan view so that the protrusions CP-2 are spaced apart from one another. Referring to FIG. 4A, the protrusions CP-2 are disposed in alternate first direction D1 extending columns and in alternate second direction D2 extending rows. Thus, an uneven shape may be defined on each of the upper surface S1 and the lower surface S2 of the inorganic layer L1 by the protrusions CP-2, and accordingly, in a cross-sectional view, the inorganic layer L1 may have the shape of a spring extending in a zigzag pattern in first to fourth directions D1, D2, D3 and D4.

Figure 5:
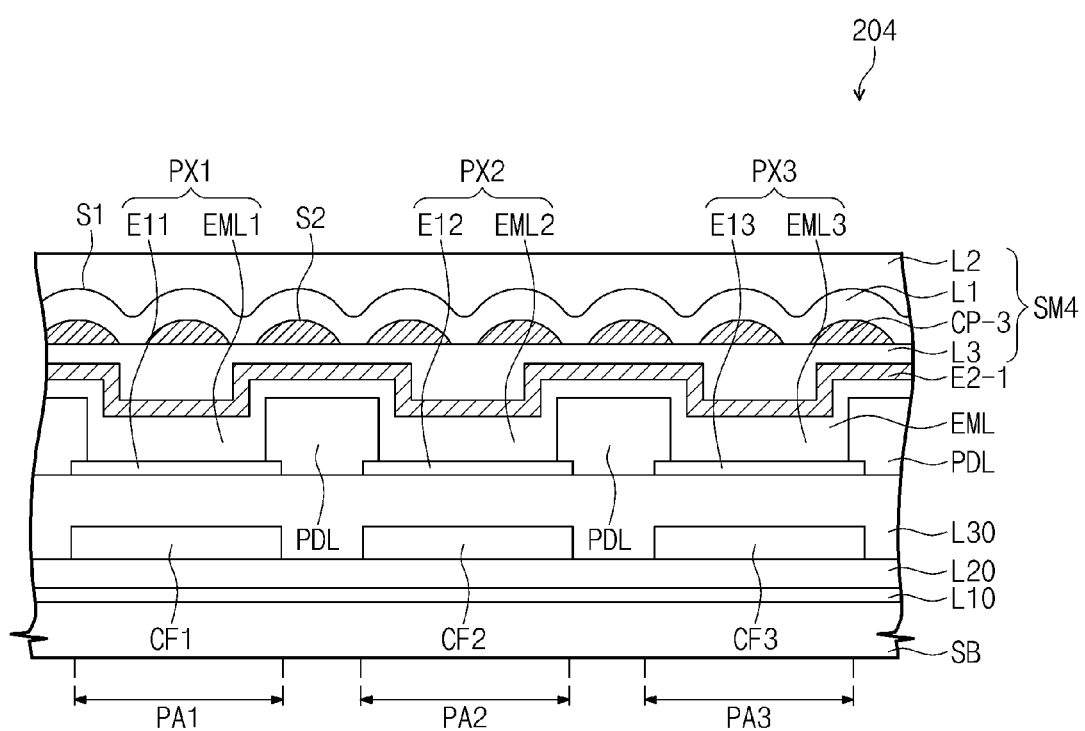
FIG. 5 is a cross-sectional view illustrating yet another exemplary embodiment of an organic electroluminescent display device according to the invention.

FIG. 5 is a cross-sectional view illustrating yet another exemplary embodiment of an organic electroluminescent display device according to the invention.

When describing FIG. 5, the same reference numerals are used for the same elements, and thus, the overlapping descriptions thereof are omitted. FIG. 5 is taken along line I-I' shown in FIG. 1A, but it is understood that elements of FIG. 5 may be applied to the exemplary embodiments in FIGS. 3A and 4A.

Referring to FIG. 5, an organic electroluminescent display device 204 includes a plurality of pixels, and a sealing member SM4 covering the plurality of pixels.

In the exemplary embodiment, the sealing member SM4 includes a plurality of protrusions CP-3, an inorganic layer L1, an upper organic layer L2 and a lower organic layer L3.

The lower organic layer L3 is disposed between the plurality of protrusions CP-3 and a cathode E2-1, and the lower organic layer L3 faces the upper organic layer L2 having the inorganic layer L1 disposed therebetween. The lower organic layer L3 may include an organic material and the organic material may be the same material as in the upper organic layer L2.

Where the sealing member SM4 further includes the lower organic layer L3 in contact with the plurality of protrusions CP-3 as in the exemplary embodiment of FIG. 5, the inorganic layer L1 may be surrounded by the upper organic layer L2 and the lower organic layer L3. Thus, the stress applied to the inorganic layer L1 may be easily absorbed by the upper organic layer L2 and the lower organic layer L3.

In the exemplary embodiment, each of the first to third pixels PX1, PX2 and PX3 may each include a portion of a continuous organic emission layer EML. The organic emission layer EML may emit white light, and the organic emission layer EML may have a shape of a single layer disposed over and common to the first to third pixel areas PA1, PA2 and PA3. The portions of the continuous organic emission layer EML of the first to third pixels PX1, PX2 and PX3 may be referred to as first to third organic emission layers EML1, EML2 and EML3.

In the exemplary embodiment, the cathode E2-1 may include a metal such as aluminum. Thus, the light emitted from the organic emission layer EML is reflected by the cathode E2-1 to be emitted to the outside of the organic electroluminescent display device 200 through the substrate SB. Therefore, even where the plurality of protrusions CP-3 includes a metal and is disposed overlapping the first to third pixel areas PA1, PA2 and PA3, the plurality of protrusions CP-3 does not overlap a path of the light emitted from the organic emission layer EML, and thus, the path of the light is not changed by the plurality of protrusions CP-3.

Where the organic emission layer EML emits the white light as in the exemplary embodiment of FIG. 5, the organic electroluminescent display device 204 may further include color filters filtering the white light into various color lights. Specifically, a red color filter CF1 may be disposed corresponding to the first pixel area PA1 and configured to emit red light from the first pixel area PA1, a green color filter CF2 may be disposed corresponding to the second pixel area PA2 and configured to emit green light from the second pixel area PA2, and a blue color filter CF3 may be disposed corresponding to the third pixel area PA3 and configured to emit blue light from the third pixel area PA3.

Figure 6:
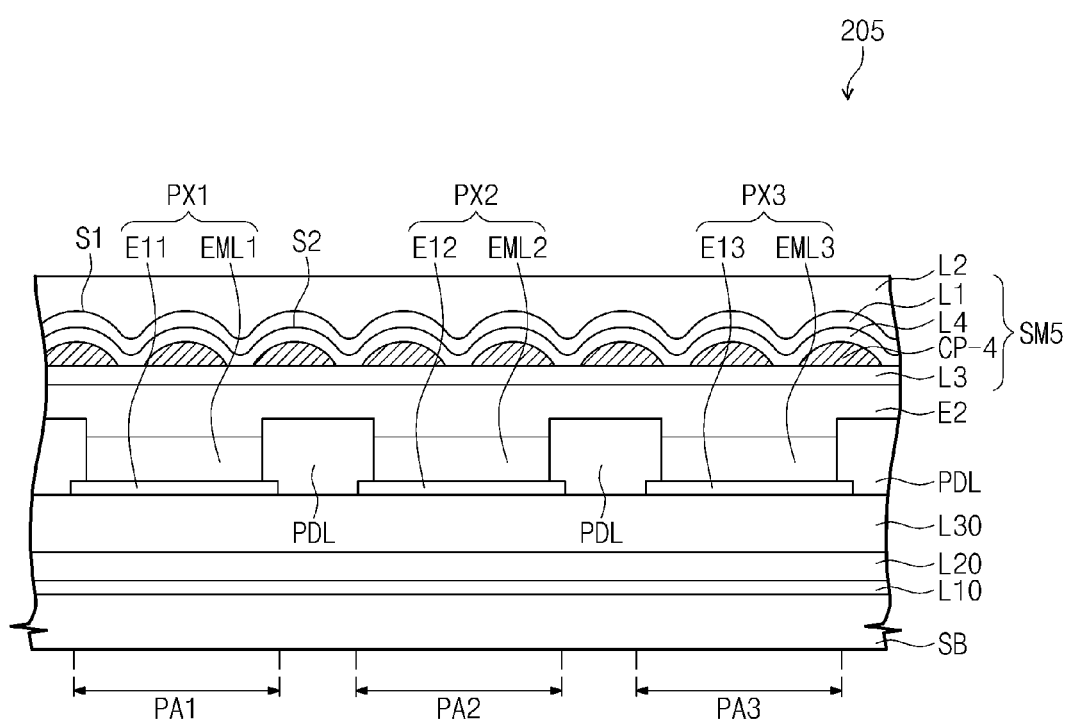
FIG. 6 is a cross-sectional view illustrating yet another exemplary embodiment of an organic electroluminescent display device according to the invention.

FIG. 6 is a cross-sectional view illustrating yet another exemplary embodiment of an organic electroluminescent display device according to the invention. When describing FIG. 6, the same reference numerals are used for the same elements, and thus, the overlapping descriptions thereof are omitted.

Referring to FIG. 6, an organic electroluminescent display device 205 includes a plurality of pixels and a sealing member SM5 covering the plurality of pixels.

In the exemplary embodiment, the sealing member SM5 includes a plurality of protrusions CP-4, an inorganic layer L1, an upper organic layer L2, a lower organic layer L3 and an intermediate organic layer L4.

The intermediate organic layer L4 includes an organic material and the organic material may be the same material as in the upper organic layer L2 and the lower organic layer L3. Since the intermediate organic layer L4 is disposed between the plurality of protrusions CP-4 and the inorganic layer L1, the plurality of protrusions CP-4 and the inorganic layer L1 are spaced apart from each other by the intermediate organic layer L4. Thus, where the plurality of protrusions CP-4 includes a metal as in the exemplary embodiment, the occurrence of a chemical reaction between a material of the inorganic layer L1 and a material of the plurality of protrusions CP-4 at an interface between the inorganic layer L1 and the plurality of protrusions CP-4 may be reduced or effectively prevented, and accordingly, the occurrence of cracks in the inorganic layer L1 due to the chemical reaction may be reduced or effectively prevented.

Also, since an upper surface S1 of the inorganic layer L1 is in contact with the upper organic layer L2 and a lower surface S2 of the inorganic layer L1 is in contact with the intermediate organic layer L4, stresses applied to the inorganic layer L1 may be more effectively absorbed by the upper organic layer L2 and the intermediate organic layer L4.

According to one or more exemplary embodiment of the invention, since an inorganic layer of a sealing member has a shape of a spring, the occurrence of cracks in the inorganic layer due to stresses applied to the inorganic layer may be reduced or effectively prevented. Thus, the reduction of moisture resistance of the sealing member due to the cracks may be reduced or effectively prevented.

Also, where protrusions defining the shape of a spring of the inorganic layer of the sealing member include a moisture absorbent, the moisture resistance of the sealing member may be improved by the moisture absorbent, and thus, the amount of moisture and gas penetrating into pixels of an organic electroluminescent display device may be minimized.

Furthermore, where the sealing member includes an organic layer covering the inorganic layer, the stresses applied to the inorganic layer may be absorbed by the organic layer, and thus, the occurrence of cracks in the sealing member may be reduced or effectively prevented.

While exemplary embodiments of the invention has been particularly shown and described with reference to the accompanying drawings, it will be understood by those of ordinary skill in the art that various changes in form and details may be made therein without departing from the spirit and scope of the invention as defined by the following claims.

What is claimed is:

1. An organic electroluminescent display device comprising:
    a substrate;
    pixels on the substrate and each comprising an organic emission layer; and
    a sealing member covering the pixels and configured to block moisture and gas from outside the organic electroluminescent display device to the pixels,
    wherein the sealing member comprises:
        protrusions on the pixels and having an uneven shape protruding toward the inorganic layer;
        an inorganic layer of which a lower surface is opposite to an upper surface thereof and closer to the pixels than the upper surface, and each of the upper surface and the lower surface of the inorganic layer has an uneven shape, and
        an upper organic layer covering the inorganic layer.

2. The organic electroluminescent display device of claim 1, wherein in a cross-sectional view, the inorganic layer extends in a zigzag pattern alternating in a direction toward the substrate and a direction away from the substrate.

3. The organic electroluminescent display device of claim 2, wherein the pixels are disposed in a plurality of pixel areas defined on the substrate, and the inorganic layer is a single layer over the plurality of pixel areas.

4. The organic electroluminescent display device of claim 1, wherein the lower surface of the inorganic layer is in contact with the protrusions, and the upper surface of the inorganic layer is in contact with the upper organic layer.

5. The organic electroluminescent display device of claim 1, wherein the uneven shape of the upper surface and the lower surface of the inorganic layer corresponds to the uneven shape of the protrusions.

6. The organic electroluminescent display device of claim 1, wherein the protrusions comprise a moisture absorbent material.

7. The organic electroluminescent display device of claim 6, wherein the moisture absorbent material comprises calcium or barium.

8. The organic electroluminescent display device of claim 1, wherein each of the protrusions comprises a moisture absorbent material.

9. The organic electroluminescent display device of claim 1, wherein the protrusions comprise a metal.

10. The organic electroluminescent display device of claim 1, wherein the sealing member further comprises a lower organic layer,
    wherein the inorganic layer is between the upper organic layer and the lower organic layer.

11. The organic electroluminescent display device of claim 10, wherein the sealing member further comprises an intermediate organic layer between the protrusions and the inorganic layer.

12. The organic electroluminescent display device of claim 1, wherein the protrusions are spaced apart from each other, and each of the protrusions has an island shape in a plan view.

13. The organic electroluminescent display device of claim 1, wherein a protrusion among the protrusions has a continuous linear shape elongated in a first direction and crossing the pixels, in a plan view.

14. The organic electroluminescent display device of claim 1, wherein the substrate has a flexible property.

15. The organic electroluminescent display device of claim 1,
    wherein the pixels are disposed in a plurality of pixel areas defined on the substrate,
    further comprising a color filter disposed in each of the plurality of pixel areas, wherein the organic emission layer is a single layer over the plurality of pixel areas.

* * * * *